United States Patent
Jung et al.

(10) Patent No.: US 9,048,143 B2
(45) Date of Patent: Jun. 2, 2015

(54) DEFECT-RESISTANT THIN FILM TRANSISTOR ARRAY PANEL AND MANUFACTURING METHOD THEREOF

(75) Inventors: Sang-Hun Jung, Asan-si (KR); Dong-Wuuk Seo, Asan-si (KR); Sun-Jung Lee, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 93 days.

(21) Appl. No.: 13/419,154

(22) Filed: Mar. 13, 2012

(65) Prior Publication Data

US 2013/0015447 A1 Jan. 17, 2013

(30) Foreign Application Priority Data

Jul. 11, 2011 (KR) ........................ 10-2011-0068594

(51) Int. Cl.
 *H01L 31/00* (2006.01)
 *H01L 27/12* (2006.01)

(52) U.S. Cl.
 CPC .................................... *H01L 27/124* (2013.01)

(58) Field of Classification Search
 CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
 USPC .......... 257/347, 741, 72, 59, 57, 208; 438/30, 438/40, 149, 158, 401, 128
 See application file for complete search history.

(56) References Cited

U.S. PATENT DOCUMENTS

| | | | |
|---|---|---|---|
| 5,905,549 A | 5/1999 | Lee | |
| 7,471,350 B2 | 12/2008 | Lee et al. | |
| 2004/0125309 A1* | 7/2004 | Nam et al. | 349/149 |
| 2007/0187689 A1* | 8/2007 | Oh et al. | 257/72 |
| 2008/0078993 A1* | 4/2008 | Cho et al. | 257/40 |
| 2009/0098673 A1* | 4/2009 | Yang et al. | 438/29 |
| 2009/0121982 A1* | 5/2009 | Choi et al. | 345/76 |
| 2009/0140269 A1* | 6/2009 | Song | 257/88 |
| 2010/0123137 A1* | 5/2010 | Yang et al. | 257/59 |
| 2011/0079783 A1* | 4/2011 | Choi | 257/59 |

FOREIGN PATENT DOCUMENTS

| | | |
|---|---|---|
| JP | 3235540 B2 | 9/2001 |
| KR | 1020010046328 A | 6/2001 |
| KR | 1020010063301 A | 9/2001 |
| KR | 1020050117845 A | 12/2005 |
| KR | 10-0577782 B1 | 5/2006 |
| KR | 1020070088044 A | 8/2007 |
| KR | 1020080056820 A | 6/2008 |
| KR | 10-0909421 B1 | 7/2009 |
| KR | 10-0920022 B1 | 10/2009 |

* cited by examiner

*Primary Examiner* — Selim Ahmed
*Assistant Examiner* — Moin Rahman
(74) *Attorney, Agent, or Firm* — Innovation Counsel LLP

(57) ABSTRACT

A thin film transistor array panel according to an exemplary embodiment of the present invention includes a substrate; a gate line disposed on the substrate; a gate insulating layer disposed on the gate line; a semiconductor disposed on the gate insulating layer; a data line disposed on the semiconductor and including a source electrode; a drain electrode disposed on the semiconductor and facing the source electrode; a first electrode disposed on the gate insulating layer; a protection electrode disposed on the data line; a passivation layer disposed on the first electrode and the protection electrode; and a second electrode disposed on the passivation layer, wherein the protection electrode comprises the same material as the first electrode.

10 Claims, 24 Drawing Sheets

FIG. 4
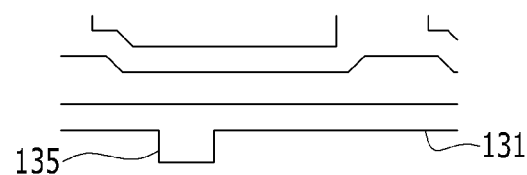
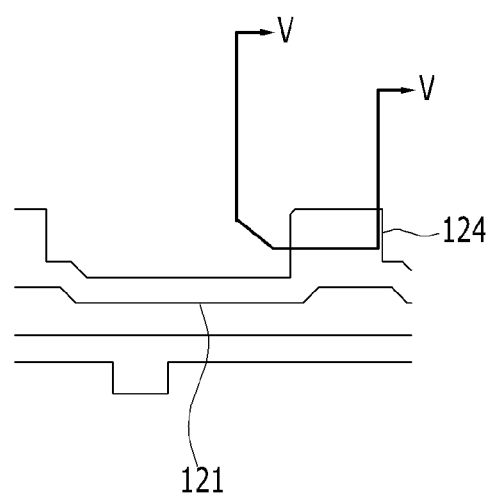

FIG. 16
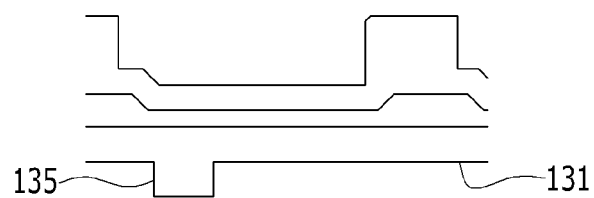
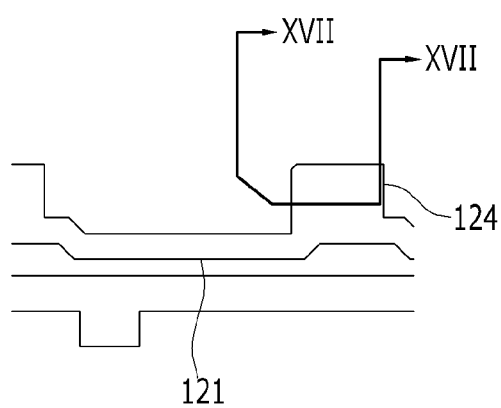

DEFECT-RESISTANT THIN FILM TRANSISTOR ARRAY PANEL AND MANUFACTURING METHOD THEREOF

CROSS-REFERENCE TO RELATED APPLICATION

This application claims priority to, and the benefit of, Korean Patent Application No. 10-2011-0068594 filed in the Korean Intellectual Property Office on Jul. 11, 2011, the entire contents of which are incorporated herein by reference.

BACKGROUND OF THE INVENTION (a) Field of the Invention

Embodiments of the present invention relate generally to flat panel displays. More specifically, embodiments of the present invention relate to defect-resistant thin film transistor array panels and manufacturing methods therefor.

(b) Description of the Related Art

Liquid crystal displays (LCDs) are one of the most widely used types of flat panel displays. They display images by applying voltages to field-generating electrodes to generate an electric field in an LC layer, thus determining orientations of LC molecules therein to adjust the polarization of incident light.

Liquid crystal displays typically offer the benefit of light weight and low profile. However, they also have drawbacks. In particular, side visibility is lower than front visibility, and liquid crystal arrangements and driving methods of various types have been developed to attempt to solve this drawback. To realize a wider viewing angle, a liquid crystal display having field generating electrodes on one substrate has been employed.

These field generating electrodes require wiring, which is typically formed through a photolithography process. However, it has been found that this wiring may be disconnected when forming via a photolithography process.

The above information disclosed in this Background section is only for enhancement of understanding of the background of the invention and therefore it may contain information not in the prior art.

SUMMARY OF THE INVENTION

Accordingly, the present invention prevents disconnection of a data line circuit in a thin film transistor array panel of a liquid crystal display. The panel may be one in which two field generating electrodes are formed on one substrate.

A thin film transistor array panel according to an exemplary embodiment of the present invention includes: a substrate; a gate line disposed on the substrate; a gate insulating layer disposed on the gate line; a semiconductor disposed on the gate insulating layer; a data line disposed on the semiconductor and including a source electrode; a drain electrode disposed on the semiconductor and facing the source electrode; a first electrode disposed on the gate insulating layer; a protection electrode disposed along and contacting the data line; a passivation layer disposed on the first electrode and the protection electrode; and a second electrode disposed on the passivation layer, wherein the protection electrode comprises the same material as the first electrode.

The first electrode may have an at least approximately planar shape, and the second electrode may include a plurality of branch electrodes.

The first electrode may be a pixel electrode, and the second electrode may be a reference electrode.

The thin film transistor array panel may further include a storage electrode line disposed at a same layer as the gate line, and the gate insulating layer and passivation layer may include a first contact hole exposing the storage electrode line.

The first electrode may be connected to the drain electrode, and the second electrode may be connected to the storage electrode line through the first contact hole.

The first electrode may be a reference electrode, and the second electrode may be a pixel electrode.

The thin film transistor array panel may further include a storage electrode line disposed at a same layer as the gate line, and an interlayer insulating layer having one surface facing the passivation layer and another opposing surface facing the gate insulating layer, the source electrode, and the drain electrode. The first electrode may be disposed on the interlayer insulating layer, the gate insulating layer and the interlayer insulating layer may include a second contact hole exposing the storage electrode line, and the passivation layer may include a third contact hole exposing the drain electrode.

The first electrode may be connected to the storage electrode line through the second contact hole, and the second electrode may be connected to the drain electrode through the third contact hole.

The first electrode and the second electrode may each comprise a transparent conductive material.

The first electrode may comprise a transparent conductive material, and the second electrode may comprise an opaque conductive material.

The protection electrode may extend to an end of the data line.

The thin film transistor array panel may further include a contact assistant disposed at the same layer as the second electrode, wherein the passivation layer includes a fourth contact hole exposing a portion of the protection electrode extending to the end of the data line, and the contact assistant is connected to the protection electrode through the fourth contact hole.

The protection electrode and the contact assistant may each comprise a transparent conductive material.

A manufacturing method of a thin film transistor panel according to an exemplary embodiment of the present invention includes: forming a gate line on a substrate; forming a gate insulating layer on the gate line; forming a semiconductor; forming a data line on the semiconductor, the data line including a source electrode; forming a drain electrode on the semiconductor; forming a first electrode on the gate insulating layer; forming a protection electrode contacting the data line; forming a passivation layer on the first electrode and the protection electrode; and forming a second electrode on the passivation layer, wherein the protection electrode comprises the same material as the first electrode.

In the thin film transistor array panel according to an exemplary embodiment of the present invention, a protection electrode made of the same material as one of the two field generating electrodes is formed on the data line, such that the data signal may be transmitted through the protection electrode even when the data line is disconnected. This helps reduce the number of defects present in the resulting display(s).

BRIEF DESCRIPTION OF THE DRAWINGS

FIG. 4, FIG. 6 and FIG. 9 are layout views sequentially showing a manufacturing method of the thin film transistor array panel of FIG. 1.

FIG. 16, FIG. 18, and FIG. 21 are layout views sequentially showing a manufacturing method of the thin film transistor array panel of FIG. 14.

DETAILED DESCRIPTION OF THE EMBODIMENTS

Figure 1:
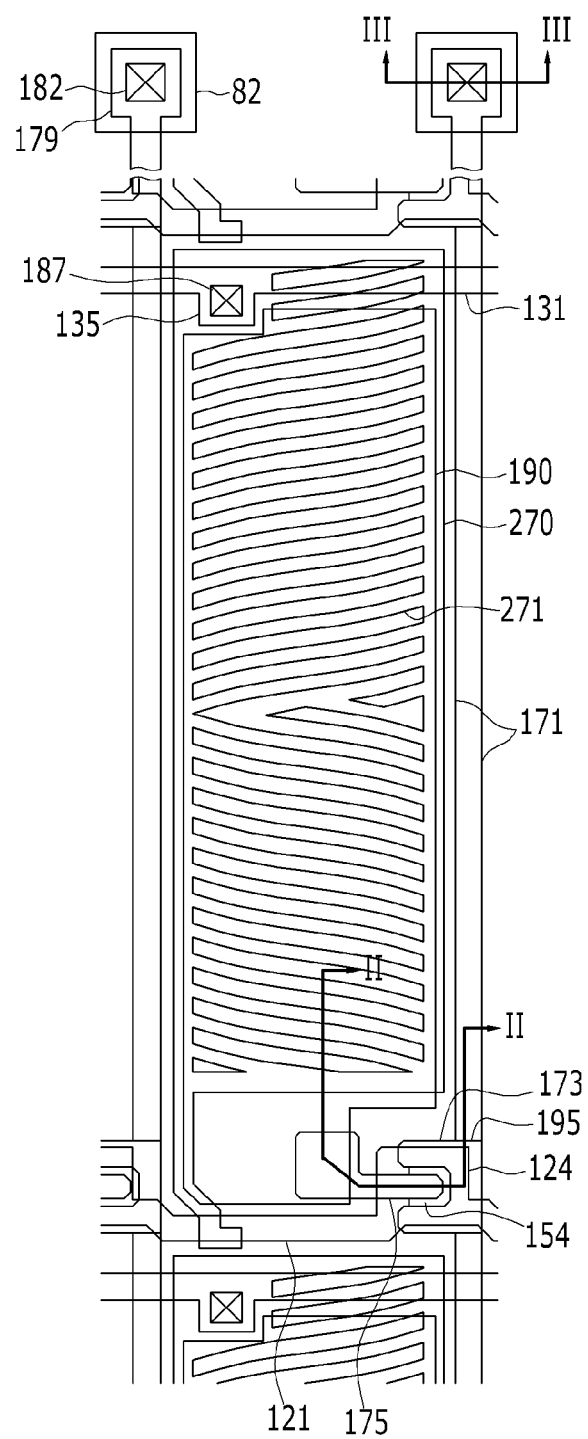
FIG. 1 is a layout view of a thin film transistor array panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a thin film transistor array panel according to an exemplary embodiment of the present invention will be described with reference to accompanying drawings.

Figure 2:
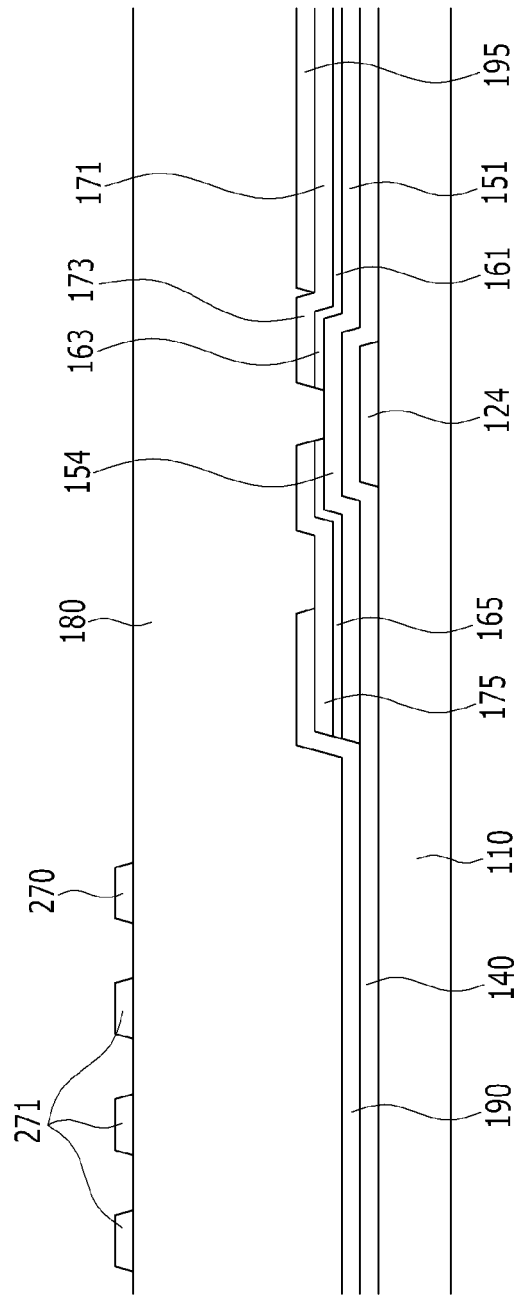
FIG. 2 is a cross-sectional view of the thin film transistor array panel of FIG. 1 taken along line II-II.
Figure 3:
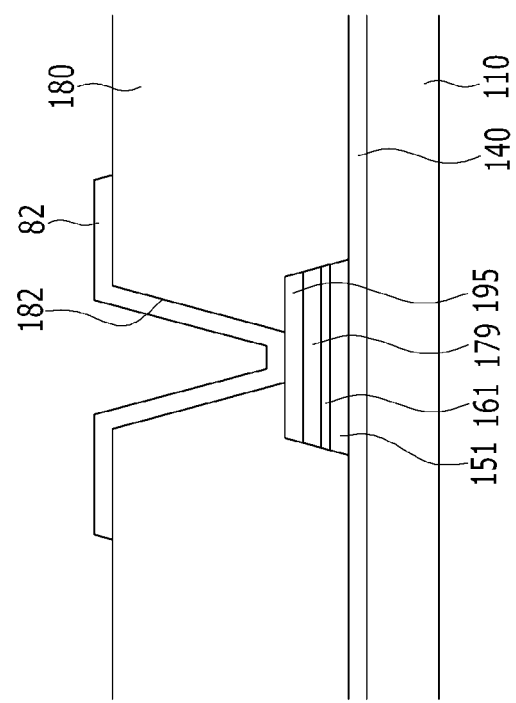
FIG. 3 is a cross-sectional view of the thin film transistor array panel of FIG. 1 taken along line III-III.

FIG. 1 is a layout view of a thin film transistor array panel according to an exemplary embodiment of the present invention, FIG. 2 is a cross-sectional view of the thin film transistor array panel of FIG. 1 taken along line II-II of FIG. 1, and FIG. 3 is a cross-sectional view of the thin film transistor array panel of FIG. 1 taken along line III-III of FIG. 1.

Referring to FIG. 1 to FIG. 3, in a thin film transistor array panel according to the present exemplary embodiment, a plurality of gate lines 121 and a plurality of storage electrode lines 131 are formed on an insulation substrate 110 that can be made of transparent glass or plastic.

Each gate line 121 transfers a gate signal, and mainly extends in a horizontal direction. Each gate line 121 includes a plurality of gate electrodes 124 protruding upward and an end portion (not shown) having a relatively wide area for connection to other layers, or to an external driving circuit. A gate driving circuit (not shown) that generates a gate signal may be mounted on a flexible printed circuit film (not shown) that is attached to the insulation substrate 110, directly mounted on the insulation substrate 110, or integrated with the insulation substrate 110. When the gate driving circuit is integrated with the substrate 110, the gate line 121 may be extended to directly connect to the circuit. Any functional connection between the gate driving circuit and substrate 110 is contemplated.

Each storage electrode line 131 receives a reference voltage, extends substantially parallel to the gate line 121, and includes a plurality of protrusions 135 protruding in the downward direction of FIG. 1 (i.e. away from storage electrode line 131).

A gate insulating layer 140 made of silicon nitride (SiNx) or silicon oxide (SiOx) is formed on the gate line 121 and the storage electrode line 131. The gate insulating layer 140 may have a multilayer structure including at least two insulating layers having different physical properties.

A plurality of semiconductor stripes 151 made of hydrogenated amorphous silicon (a-Si) or polysilicon are formed on the gate insulating layer 140. The semiconductor stripes 151 mainly extend in a longitudinal direction and include a plurality of projections 154 extending toward the gate electrode 124.

A plurality of ohmic contact stripes and islands 161 and 165 are formed on the semiconductor stripes 151. The ohmic contacts 161 and 165 may be made of a material such as n+ hydrogenated amorphous silicon, in which an n-type impurity such as phosphorus is doped to a high concentration, or of a silicide. The ohmic contact stripes 161 have a plurality of projections 163, and the projections 163 and the ohmic contact islands 165 are formed in pairs on the projections 154 of the semiconductor stripes 151.

A plurality of data lines 171 and a plurality of drain electrodes 175 are formed on the ohmic contacts 161 and 165.

The data lines 171 transmit the data signal and mainly extend in the longitudinal direction, thereby intersecting the gate lines 121. Each data line 171 includes a plurality of source electrodes 173 that are extended toward the gate electrode 124, and a wide end 179 for connecting to other layers or to an external driving circuit.

Each drain electrode 175 is separated from the data line 171 and faces a corresponding source electrode 173 over a respective gate electrode 124. The drain electrode 175 includes a bar-shaped end portion on one end, and an extension having a wide area on the other. The bar-shaped end portion is partially enclosed by the curved source electrode 173.

The gate electrode 124, the source electrode 173, and the drain electrode 175 collectively form a thin film transistor (TFT) along with the projections 154 of the semiconductor 151, and a channel of the thin film transistor is formed in the semiconductor 154 between the source electrode 173 and the drain electrode 175.

The ohmic contact stripes and islands 161 and 165 exist only between their underlying semiconductor stripes 151 and overlying data lines 171 and drain electrodes 175, to lower contact resistance therebetween.

A pixel electrode 190 is formed on the drain electrode 175 and the gate insulating layer 140, and a protection electrode 195 is formed on the data line 171. The protection electrode 195 contacts a length of the data line 171, and extends substantially to the end 179 of the data line 171.

The pixel electrode 190 substantially covers its pixel area and directly contacts an expansion of the drain electrode 175, thereby receiving the data voltage from the drain electrode 175.

The protection electrode 195 is formed with the same material as the pixel electrode 190 and is positioned on the data line 171 to transmit the data signal when the data line 171 is disconnected.

The pixel electrode 190 and the protection electrode 195 are made of a transparent conductive material such as indium tin oxide (ITO) or indium zinc oxide (IZO).

A passivation layer 180 is formed on the source electrode 173, the drain electrode 175, the protrusion 154 of the exposed semiconductor stripe 151, and the protection electrode 195.

The passivation layer 180 is made of an inorganic insulator, an organic insulation material, etc., and can have a planarized surface. Examples of an inorganic insulator can be silicon nitride and silicon oxide. The organic insulator can have photosensitivity, and preferably a dielectric constant of not greater than about 4.0. In this respect, the passivation layer 180 may also have a dual-layered structure with a lower inorganic layer and an upper organic layer, so that it may avoid harming the exposed portion of the semiconductor stripe 151 while still sustaining the desirable insulation characteristics of the organic layer.

The passivation layer 180 and the gate insulating layer 140 have a first contact hole 187 extending therethrough and exposing the protrusion 135 of the storage electrode line 131. Also, the passivation layer 180 has a fourth contact hole 182 exposing the protection electrode 195 positioned on the end 179 of the data line 171.

A reference electrode 270 and a contact assistant 82 are formed on the passivation layer 180. The reference electrode 270 and the contact assistant 82 are made of a transparent conductive material such as indium tin oxide (ITO) or indium zinc oxide (IZO). Also, the reference electrode 270 and the contact assistant 82 may be made of an opaque transparent conductive material (or simply an opaque conductive material) such as an aluminum-based metal of aluminum (Al) or aluminum alloys, a silver-based metal of silver (Ag) or silver alloys, a molybdenum-based metal of molybdenum (Mo) or molybdenum alloys, chromium (Cr), tantalum (Ta), and/or titanium (Ti).

The reference electrode 270 is connected to the protrusion 135 of the storage electrode line 131 through the first contact hole 187 and receives a reference voltage from the storage electrode line 131.

The reference electrode 270 includes a plurality of branch electrodes 271. The branch electrodes 271 of the reference electrode 270 extend in a direction substantially parallel to the gate lines 121, though at a relatively small angle with respect to the gate lines 121. In particular, the branch electrodes 271 may be inclined to form an angle of about 5 degrees to about 20 degrees with the gate lines 121.

When data voltages are applied to the pixel electrode 190, and a reference voltage is applied to the reference electrode 270, the pixel electrode 190 and the reference electrode 270 together generate an electric field such that liquid crystal molecules (not shown) of a liquid crystal layer on the two electrodes 191 and 270 are rotated in a direction parallel to the electric field. Polarization of light that transmits through the liquid crystal layer can be varied according to the rotation direction of the liquid crystal molecules.

In the present exemplary embodiment, the pixel electrode has a generally or at least approximately planar shape (i.e., is largely flat) and the reference electrode includes a plurality of branch electrodes. However, the invention is not limited to this configuration. For example, the pixel electrode may include a plurality of branch electrodes and the reference electrode may have a generally, or at least approximately, planar shape.

The contact assistant 82 contacts the protection electrode 195 through the fourth contact hole 182. Also, the invention includes embodiments in which the protection electrode 195 does not extend all the way to the fourth contact hole 182, and the contact assistant 82 instead contacts the end 179 of the data line 171 directly.

As described above, the protection electrode 195 can be made of the same material as the pixel electrode 190, and is formed on the data line 171 such that the data signal may be transmitted through the protection electrode 195 even when the data line 171 is disconnected. That is, the protection electrode 195 is conductive, and extends along a substantial length of the data line 171 (such as from the source electrode 173 all the way to the other end 179 of data line 171), contacting the data line 171 at multiple places along this length (or, as shown, contacting the entirety of this length in a continuous fashion), so that data signals are still sent to their intended destinations even when a break in the data line 171 occurs. In particular, the protection electrode 195 contacts both the end of data line 171 next to or near the source electrode 173, and the other end 179 of data line 171, so that any break along the length of the data line 171 can be compensated for.

Next, a manufacturing method for the thin film transistor array panel of FIG. 1 will be described with reference to FIG. 4 to FIG. 11 as well as FIG. 1 to FIG. 3.

Figure 6:
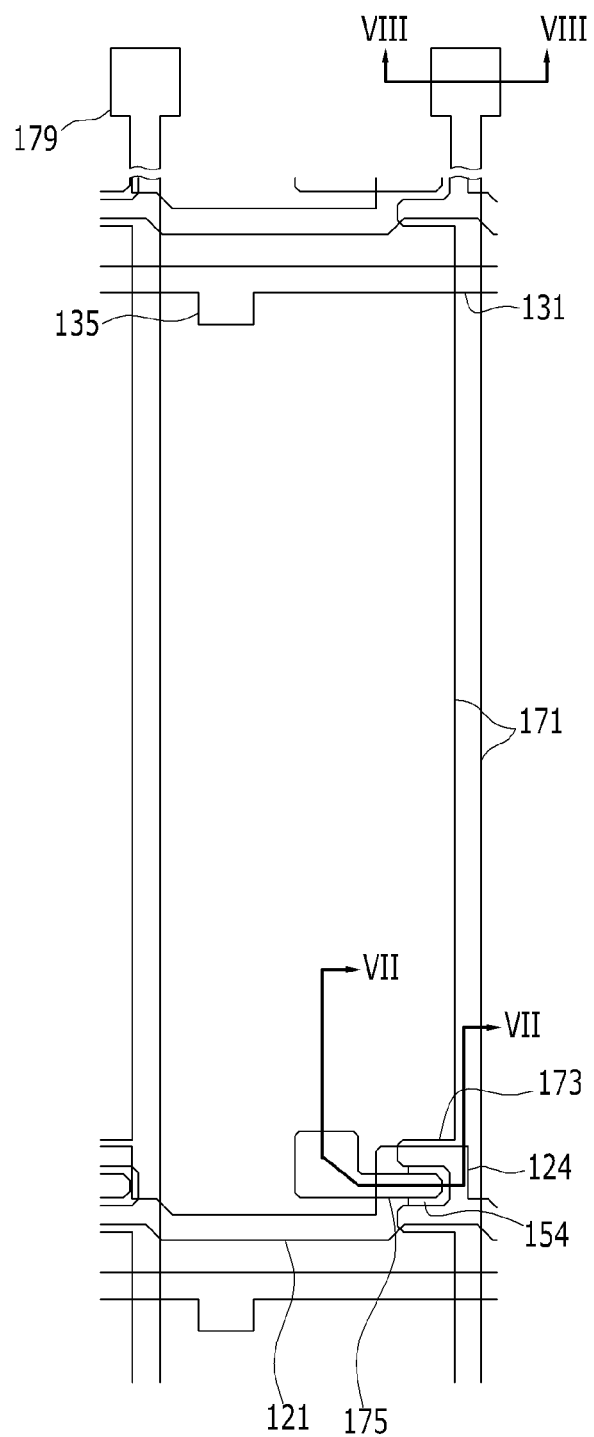
Figure 9:
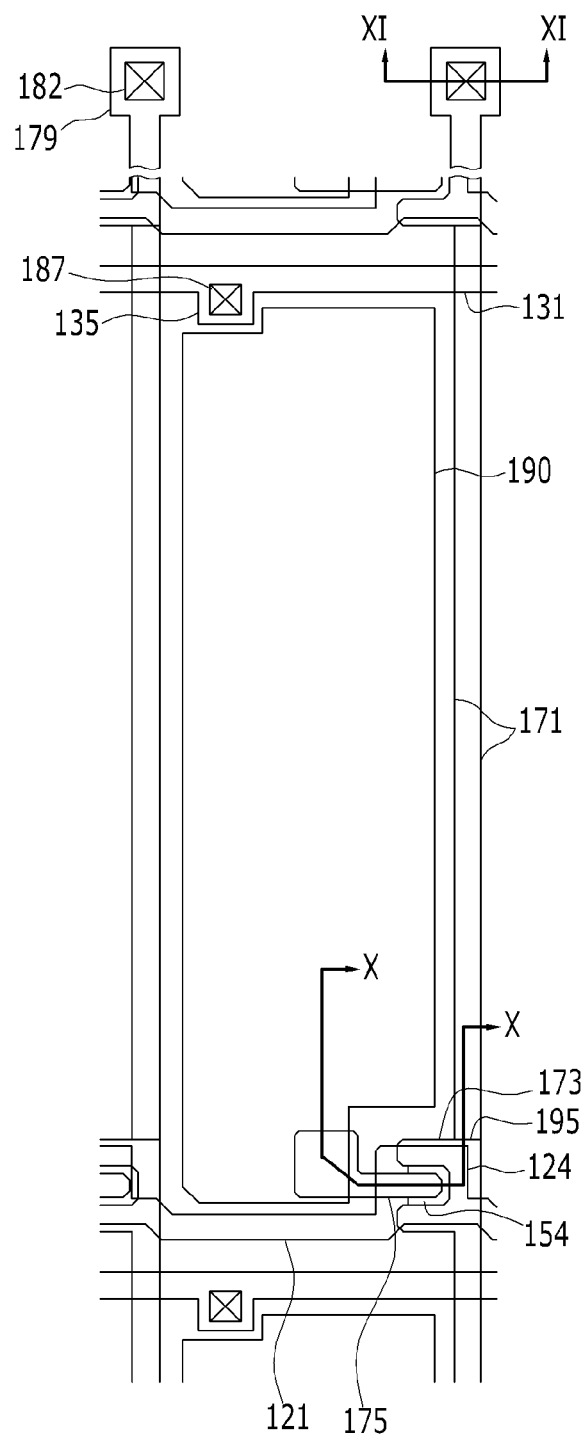

FIG. 4, FIG. 6, and FIG. 9 are layout views sequentially showing a manufacturing method for the thin film transistor array panel of FIG. 1.

Figure 5:
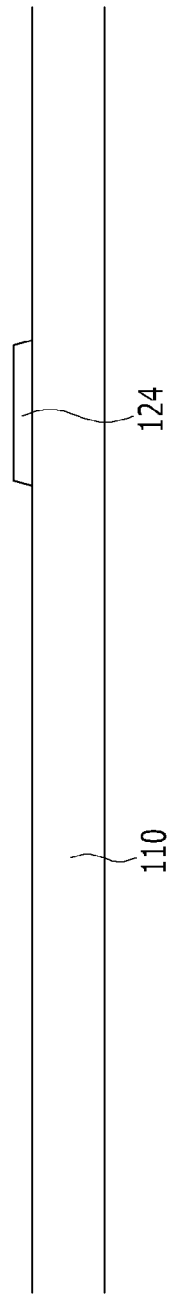
FIG. 5 is a cross-sectional view of the thin film transistor array panel of FIG. 4 taken along line V-V.
Figure 7:
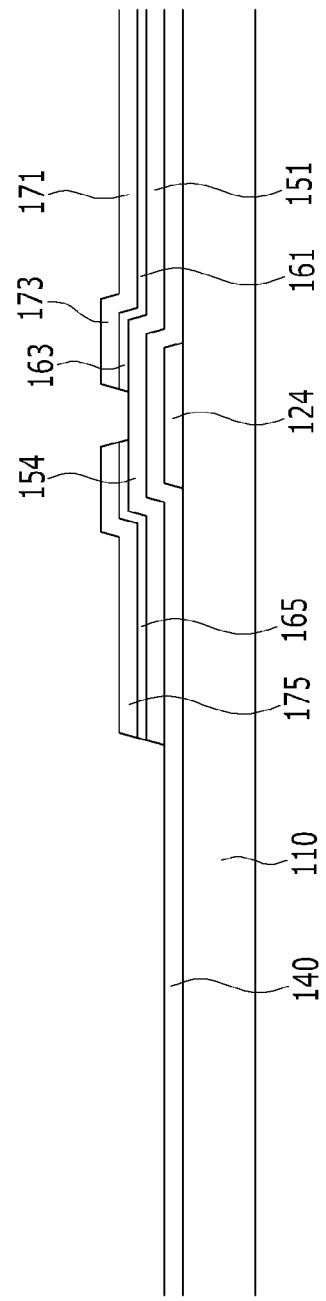
FIG. 7 is a cross-sectional view of the thin film transistor array panel of FIG. 6 taken along line VII-VII.
Figure 8:
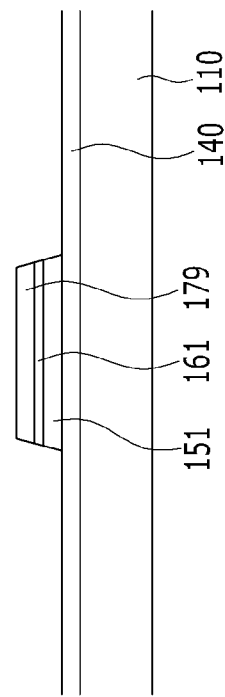
FIG. 8 is a cross-sectional view of the thin film transistor array panel of FIG. 6 taken along line VIII-VIII.
Figure 10:
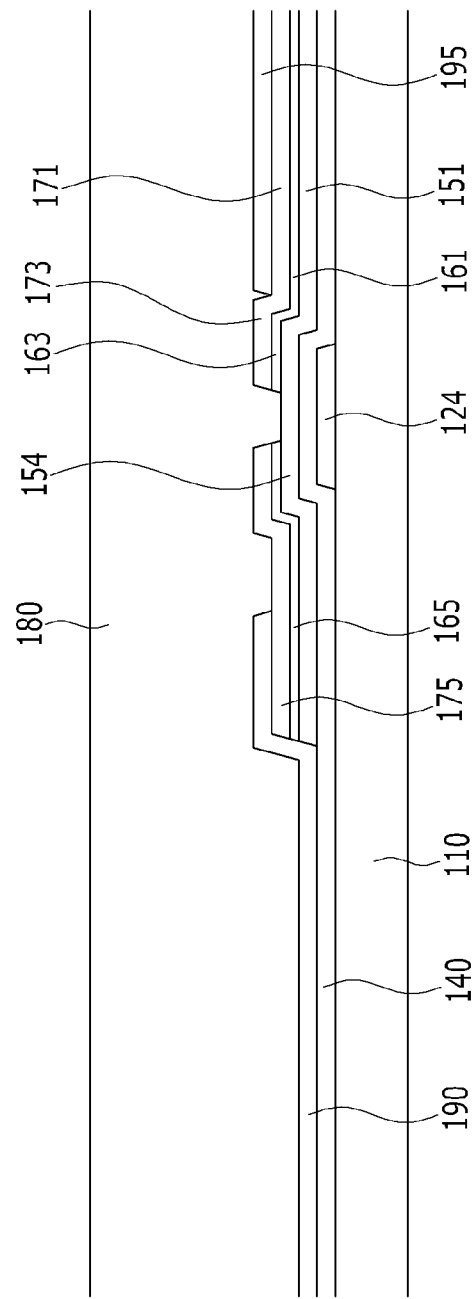
FIG. 10 is a cross-sectional view of the thin film transistor array panel of FIG. 9 taken along line X-X.
Figure 11:
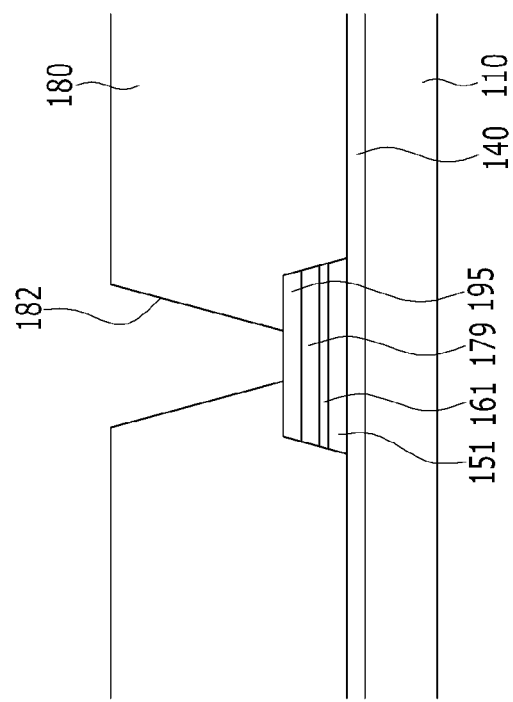
FIG. 11 is a cross-sectional view of the thin film transistor array panel of FIG. 9 taken along line XI-XI.

FIG. 5 is a cross-sectional view of the thin film transistor array panel of FIG. 4 taken along line V-V, FIG. 7 is a cross-sectional view of the thin film transistor array panel of FIG. 6 taken along line VII-VII, FIG. 8 is a cross-sectional view of the thin film transistor array panel of FIG. 6 taken along line VIII-VIII, FIG. 10 is a cross-sectional view of the thin film transistor array panel of FIG. 9 taken along line X-X, and FIG. 11 is a cross-sectional view of the thin film transistor array panel of FIG. 9 taken along line XI-XI.

Referring to FIG. 4 and FIG. 5, each gate line 121, including a gate electrode 124 and a storage electrode line 131, is formed on the insulation substrate 110. The storage electrode line 131 includes protrusion 135 protruding downward.

Referring to FIG. 6 to FIG. 8, the gate insulating layer 140 is deposited on the gate line 121 and the storage electrode line 131, and the semiconductor 151. Subsequently, the ohmic contacts 161 and 165, and the data line 171 and the drain electrode 175 are simultaneously formed by using one mask. By varying the thickness of a photosensitive film depending on positions, the semiconductor 151, the ohmic contacts 161 and 165, the data line 171, and the drain electrode 175 may be simultaneously formed by using the one mask. There are various methods for forming the photosensitive pattern such that portions thereof have different thicknesses depending on their positions. For example, an exposure mask including a transparent area, a light blocking area, and a semi-transparent area may be used. The semi-transparent area includes a slit pattern, a lattice pattern, or a thin film having an intermediate transmittance or having an intermediate thickness. When the slit pattern is used, the width of the slits or the space between the slits is preferably smaller than the resolution of the light exposer used for photolithography. Another example includes using a reflowable photosensitive film. That is, area photosensitive film is formed with gaps therein, typically by using a general exposure mask. Then, additional photosensitive film is flowed into the gaps.

Referring to FIG. 9 to FIG. 11, the pixel electrode 190 is formed on the gate insulating layer 140 and the drain electrode 175, and the protection electrode 195 is formed on the data line 171.

The pixel electrode 190 has a generally planar shape covering the pixel area, and directly contacts the drain electrode 175. The protection electrode 195 is formed with the same material as the pixel electrode 190 and contacts the data line 171. The protection electrode 195 extends to the end 179 of the data line 171, thereby contacting the end 179 of the data line 171.

The pixel electrode 190 and the protection electrode 195 are formed of a transparent conductive material such as indium tin oxide (ITO) or indium zinc oxide (IZO).

Next, after the passivation layer 180 is formed on the pixel electrode 190, the protection electrode 195, the source electrode 173, the protrusion 154 of the semiconductor 151, the gate insulating layer 140, and the passivation layer 180 are patterned to form the first contact hole 187 and fourth contact hole 182. The first contact hole exposes the protrusion 135 of the storage electrode line 131, and the fourth contact hole 182 exposes the protection electrode 195 on the end 179 of the data line 171.

Next, as shown in FIG. 1 to FIG. 3, the reference electrode 270 (connected to the protrusion 135 of the storage electrode line 131 through the first contact hole 187) and the contact assistant 82 (connected to the protection electrode 195 through the fourth contact hole 182) are formed on the passivation layer 180.

The reference electrode 270 and the contact assistant 82 are made of a transparent conductive material such as indium tin oxide (ITO) or indium zinc oxide (IZO). Also, the reference electrode 270 and the contact assistant 82 may be made of an opaque transparent conductive material such as an aluminum-based metal of aluminum (Al) or aluminum alloys, a silver-based metal of silver (Ag) or silver alloys, a molybdenum-based metal of molybdenum (Mo) or molybdenum alloys, chromium (Cr), tantalum (Ta), and/or titanium (Ti).

The reference electrode 270 includes the above-described plurality of branch electrodes 271. As noted above, the branch electrodes 271 of the reference electrode 270 extend in a direction substantially parallel to the gate lines 121, and may be inclined to form an angle of about 5 degrees to about 20 degrees with the gate lines 121.

Alternatively, an interlayer insulating layer 145 may be positioned between the pixel electrode 190 and the drain electrode 175.

Figure 12:
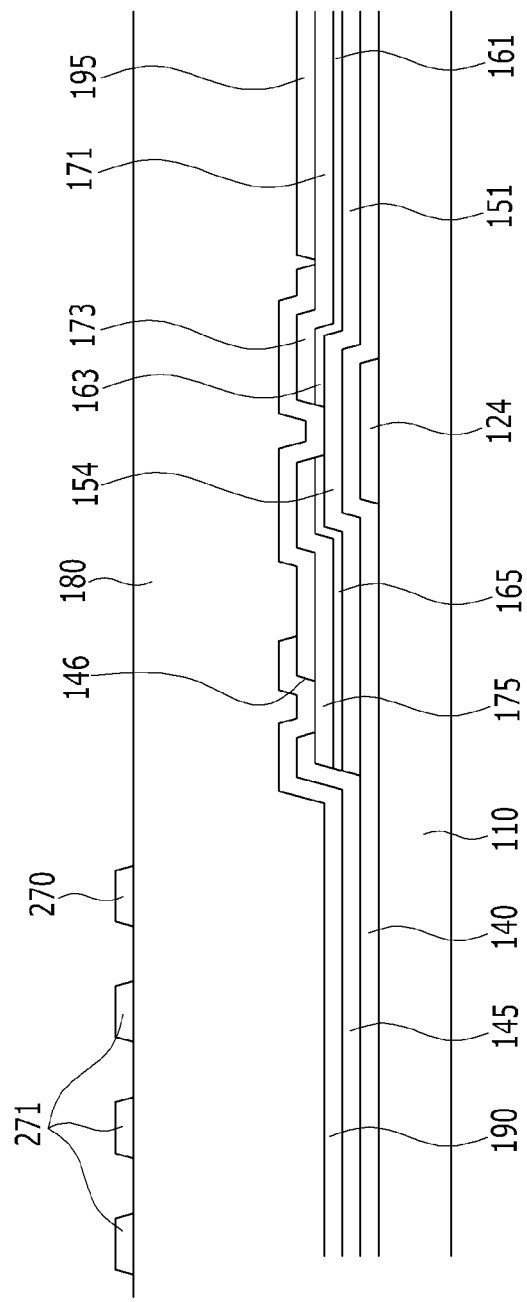
FIG. 12 is a cross-sectional view of a thin film transistor according to another exemplary embodiment of the present invention.

FIG. 12 is a cross-sectional view of a thin film transistor array panel according to another exemplary embodiment of the present invention.

The thin film transistor array panel of FIG. 12 has a similar structure to that of the thin film transistor array panel of FIG. 1 to FIG. 3. Description of similar structures is omitted.

Differently from the thin film transistor array panel shown in FIG. 1 to FIG. 3, the thin film transistor array panel according to the present exemplary embodiment shown in FIG. 12 is formed with the interlayer insulating layer 145 between the pixel electrode 190 and the drain electrode 175.

The interlayer insulating layer 145 is formed on the gate insulating layer 140, the source electrode 173, and the drain electrode 175, and includes a fifth contact hole 146 exposing the drain electrode 175. The interlayer insulating layer 145 is not positioned on the data line 171, but rather exposes the data line 171. That is, the interlayer insulating layer 145 is formed over the source electrode 173, but not the data line 171.

The protection electrode 195 is formed on the data line 171. The protection electrode 195 is positioned on the data line 171, thereby transmitting the data signal when the data line 171 is disconnected.

The pixel electrode 190 is formed on the interlayer insulating layer 145 and is connected to the drain electrode 175 through the fifth contact hole 146.

Hereinafter, a thin film transistor array panel according to another exemplary embodiment of the present invention will be described with reference to FIG. 13 to FIG. 15.

Figure 13:
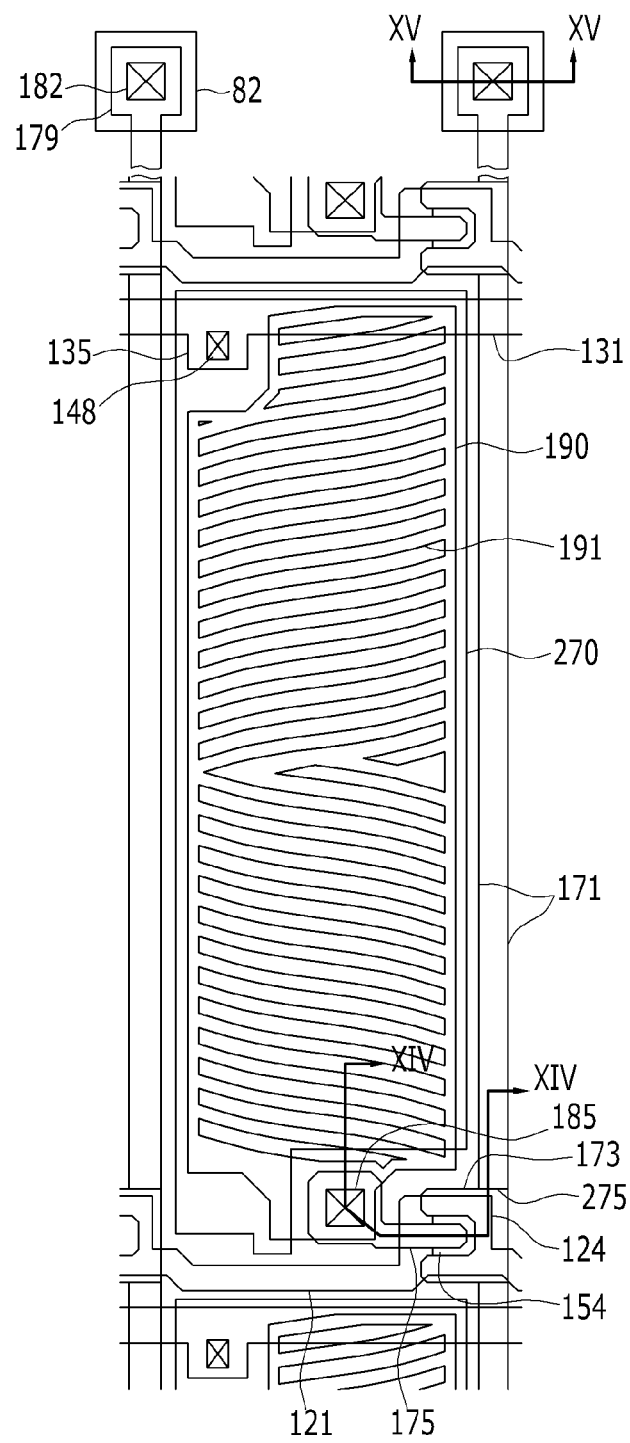
FIG. 13 is a layout view of a thin film transistor according to another exemplary embodiment of the present invention.
Figure 14:
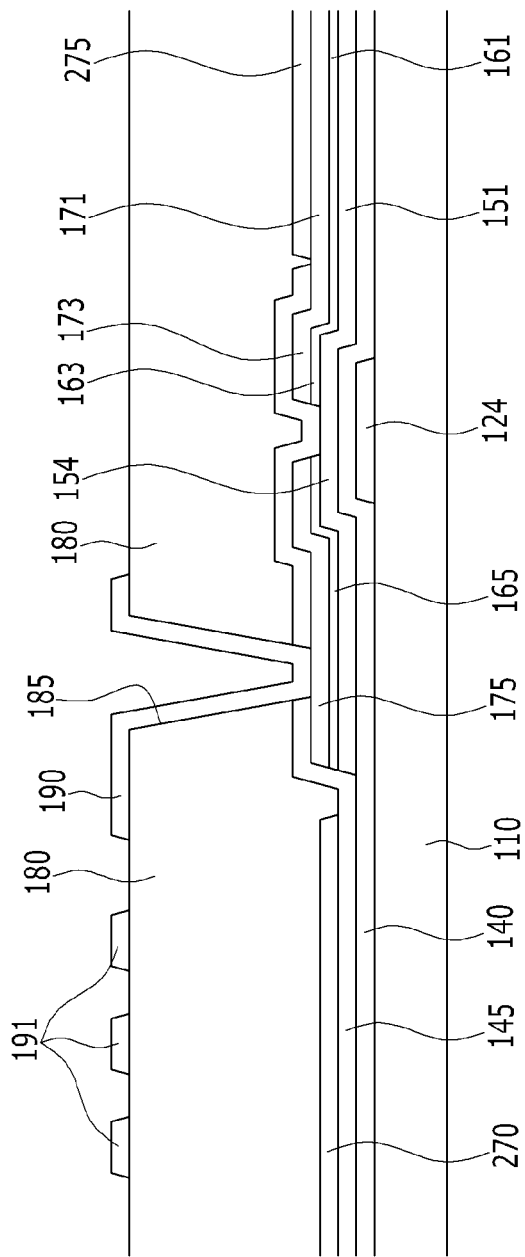
FIG. 14 is a cross-sectional view of the thin film transistor array panel of FIG. 13 taken along line XIV-XIV.
Figure 15:
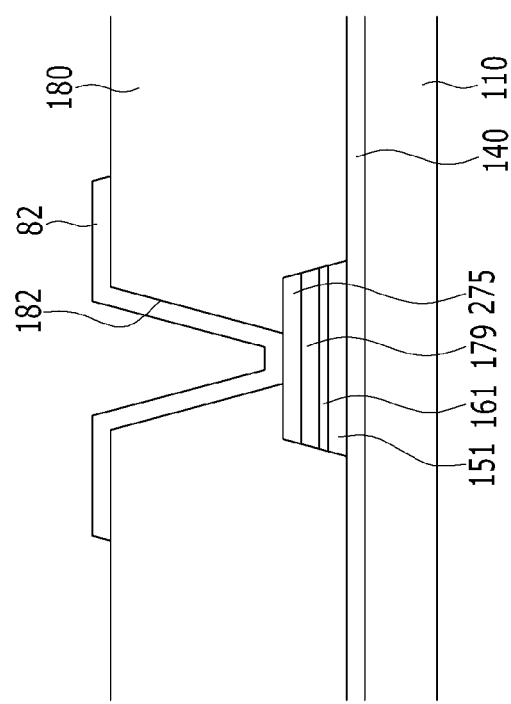
FIG. 15 is a cross-sectional view of the thin film transistor array panel of FIG. 13 taken along line XV-XV.

FIG. 13 is a layout view of a thin film transistor according to another exemplary embodiment of the present invention, FIG. 14 is a cross-sectional view of the thin film transistor array panel of FIG. 13 taken along line XIV-XIV, and FIG. 15 is a cross-sectional view of the thin film transistor array panel of FIG. 13 taken along line XV-XV.

Referring to FIG. 13 to FIG. 15, in a thin film transistor array panel according to the present exemplary embodiment, a plurality of gate lines 121 and a plurality of storage electrode lines 131 are formed on an insulation substrate 110 made of transparent glass or plastic.

Each gate line 121 transfers a gate signal and mainly extends in a horizontal direction. Each gate line 121 includes a plurality of gate electrodes 124 protruding upward and an end portion (not shown) having a wide area for connection to other layers or to an external driving circuit.

The storage electrode line 131 receives a reference voltage, extends substantially parallel to the gate line 121, and includes a plurality of protrusions 135 protruding downward.

A gate insulating layer 140 made of silicon nitride (SiNx) or silicon oxide (SiOx) is formed on the gate line 121 and the storage electrode line 131. The gate insulating layer 140 may have a multilayer structure including at least two insulating layers having different physical properties.

A plurality of semiconductor stripes 151 made of hydrogenated amorphous silicon (a-Si) or polysilicon are formed on the gate insulating layer 140. The semiconductor stripes 151 mainly extend in a longitudinal direction and include a plurality of projections 154 protruded toward the gate electrode 124.

A plurality of ohmic contact stripes and islands 161 and 165 are formed on the semiconductor stripes 151. The ohmic contacts 161 and 165 may be made of a material such as n+ hydrogenated amorphous silicon in which an n-type impurity such as phosphorus is doped to a high concentration, or of a silicide. The ohmic contact stripes 161 have a plurality of projections 163, and the projections 163 and the ohmic contact islands 165 are formed in pairs on the projections 154 of the semiconductor stripes 151.

A plurality of data lines 171 and a plurality of drain electrodes 175 are formed on the ohmic contacts 161 and 165.

The data lines 171 transmit the data signal and mainly extend in the longitudinal direction, thereby intersecting the gate lines 121. Each data line 171 includes a plurality of source electrodes 173 that are extended toward the gate electrode 124, and a wide end 179 for connecting to other layers or to an external driving circuit.

Each drain electrode 175 is separated from the data line 171 and faces its source electrode 173 over the corresponding gate electrode 124. The drain electrode 175 includes a bar-shaped end portion and an opposite extension having a wide area. The bar-shaped end portion is partially enclosed by the curved source electrode 173.

The ohmic contact stripes and islands 161 and 165 exist only between the underlying semiconductor stripes 151 and the overlying data lines 171 and drain electrodes 175 to lower contact resistance therebetween.

An interlayer insulating layer 145 is formed on the gate insulating layer 140, the source electrode 173, and the drain electrode 175. The interlayer insulating layer 145 and the gate insulating layer 140 have a second contact hole 148 exposing the protrusion 135 of the storage electrode line 131. The interlayer insulating layer 145 is not positioned on the data line 171, but rather exposes the data line 171.

A protection electrode 275 is formed on the data line 171. The protection electrode 275 is positioned on the data line 171, thereby transmitting the data signal when the data line 171 is disconnected. The protection electrode 275 extends to the end 179 of the data line 171.

A reference electrode 270 is formed on the interlayer insulating layer 145. The reference electrode 270 has generally the same shape as the pixel area. The reference electrode 270 is connected to the protrusion 135 of the storage electrode line 131 through the second contact hole 148, thereby receiving the reference voltage from the storage electrode line 131.

The reference electrode 270 and the protection electrode 275 are made of a transparent conductive material such as ITO or IZO. In this embodiment, the reference electrode 270 and the protection electrode 275 are made of the same material.

A passivation layer 180 is formed on the reference electrode 270, the protection electrode 275, and the interlayer insulating layer 145. The passivation layer 180 has a third contact hole 185 exposing the drain electrode 175 and a fourth contact hole 182 exposing the protection electrode 275 positioned on the end 179 of the data line 171.

A pixel electrode 190 and contact assistant 82 are formed on the passivation layer 180. The pixel electrode 190 is connected to the drain electrode 175 through the third contact hole 185, thereby receiving the data voltage from the drain electrode 175.

The contact assistant 82 contacts the protection electrode 275 through the fourth contact hole 182. Also, the end 179 of the data line 171 may directly contact the contact assistant 82 without the protection electrode 275.

The pixel electrode 190 and the contact assistant 82 are made of a transparent conductive material such as ITO or IZO. Also, the pixel electrode 190 and the contact assistant 82 may be made of an opaque transparent conductive material such as an aluminum-based metal of aluminum (Al) or aluminum alloys, a silver-based metal of silver (Ag) or silver alloys, a molybdenum-based metal of molybdenum (Mo) or molybdenum alloys, chromium (Cr), tantalum (Ta), and/or titanium (Ti).

The pixel electrode 190 includes a plurality of branch electrodes 191. The branch electrodes 191 of the pixel electrode 190 extend in a direction substantially parallel to, yet slightly inclined with respect to, the gate lines 121, and may be inclined to form an angle of about 5 degrees to about 20 degrees with the gate lines 121.

When data voltages are applied to the pixel electrode 191 and a reference voltage is applied to the reference electrode 270, an electric field is generated between the electrodes 191, 270, and liquid crystal molecules (not shown) of a liquid crystal layer on the two electrodes 191 and 270 are rotated in a direction parallel to the electric field. Polarization of light that transmits through the liquid crystal layer can be varied according to the rotation direction of the liquid crystal molecules.

In the present exemplary embodiment, the reference electrode has a generally, or at least approximately, planar shape and the pixel electrode includes the plurality of branch electrodes. However, the invention is not limited to this arrangement. For example, the invention also encompasses configurations in which the reference electrode may include the plurality of branch electrodes and the pixel electrode may have a generally/approximately planar shape.

As described above, the protection electrode 275 is formed with the same material as the reference electrode 270, such that the data signal may be transmitted through the protection electrode 275 even when the data line 171 is disconnected.

Next, a manufacturing method for a thin film transistor array panel according to another exemplary embodiment of the present invention will be described with reference to FIG. 16 to FIG. 23 as well as FIG. 13 to FIG. 15.

Figure 18:
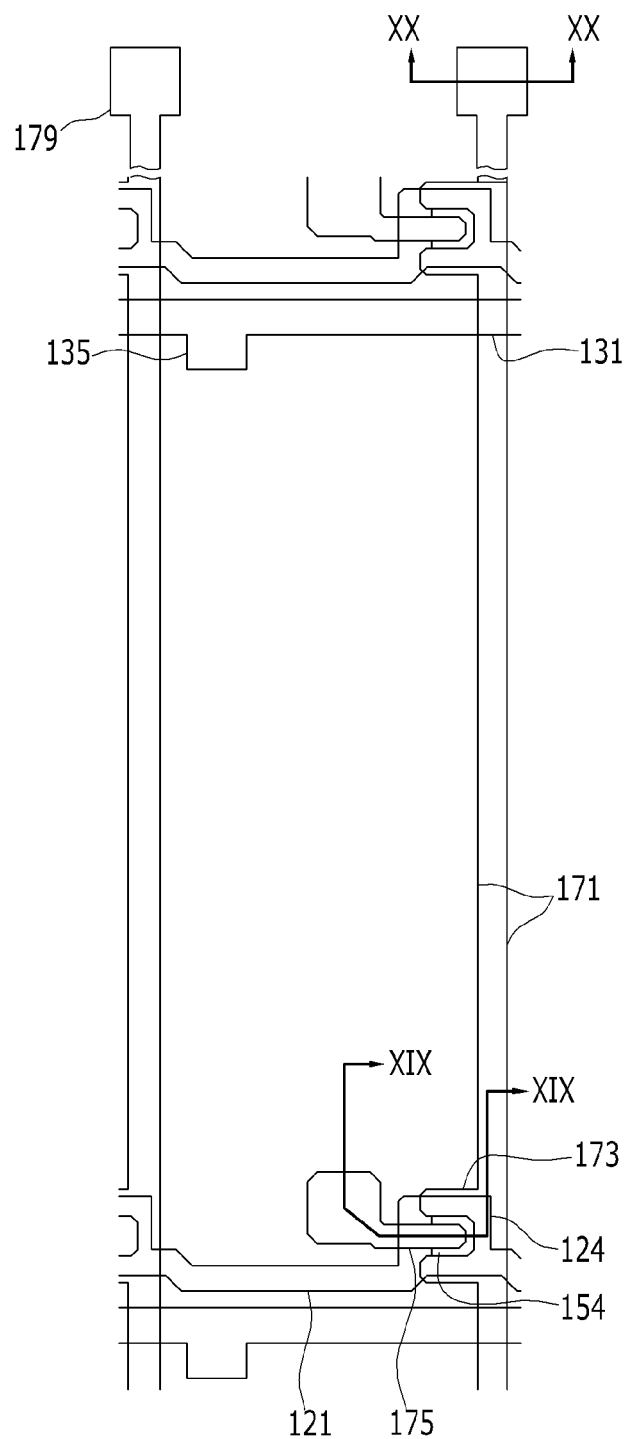
Figure 21:
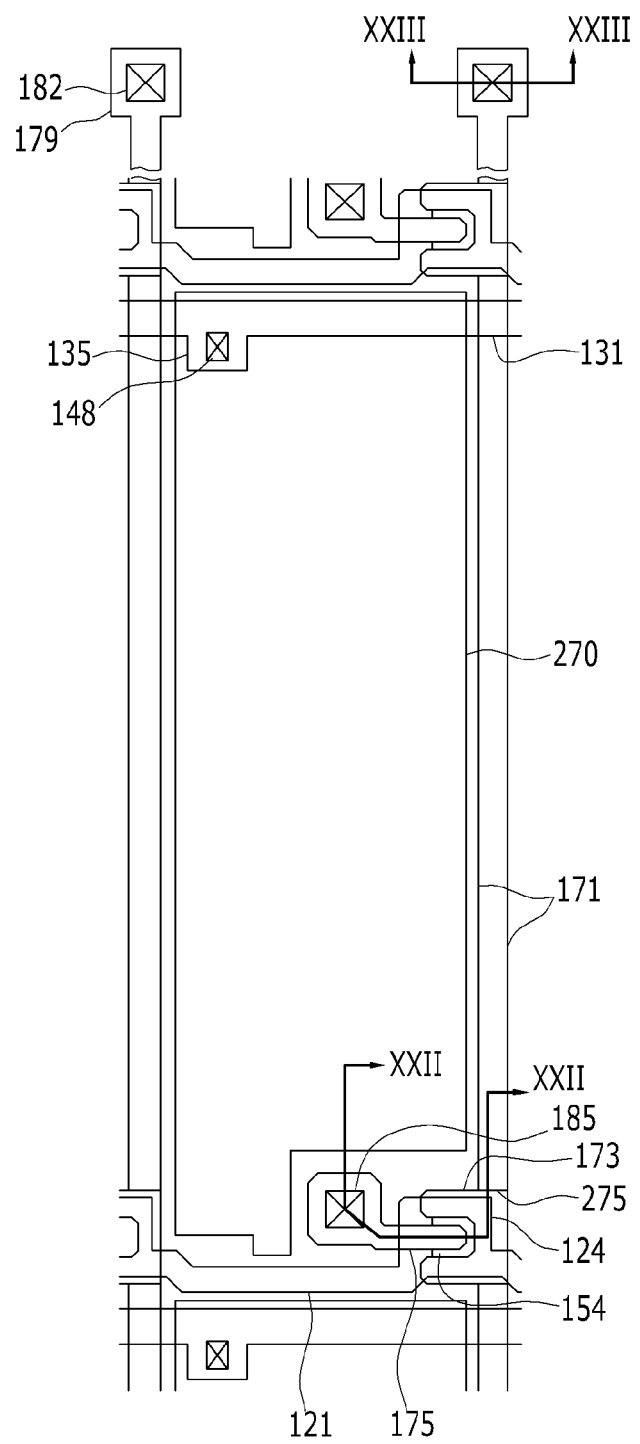

FIG. 16, FIG. 18, and FIG. 21 are layout views sequentially showing a manufacturing method for the thin film transistor array panel of FIG. 14.

Figure 17:
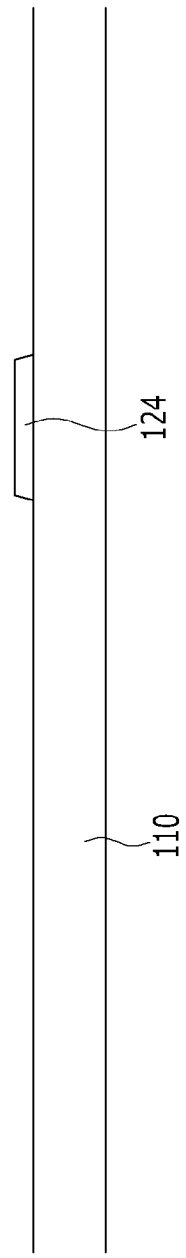
FIG. 17 is a cross-sectional view of the thin film transistor array panel of FIG. 16 taken along line XVII-XVII.
Figure 19:
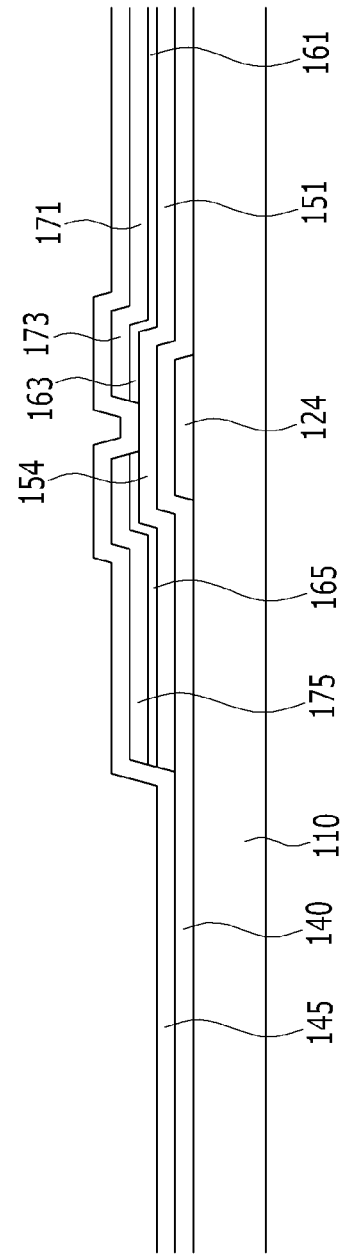
FIG. 19 is a cross-sectional view of the thin film transistor array panel of FIG. 18 taken along line XIX-XIX.
Figure 20:
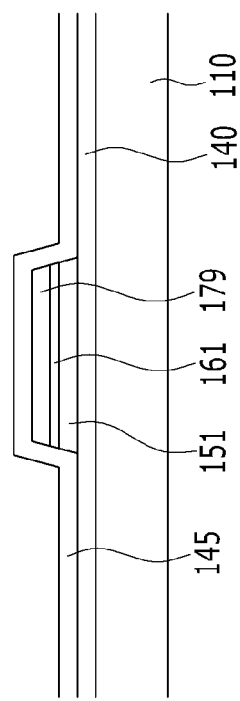
FIG. 20 is a cross-sectional view of the thin film transistor array panel of FIG. 18 taken along line XX-XX.
Figure 22:
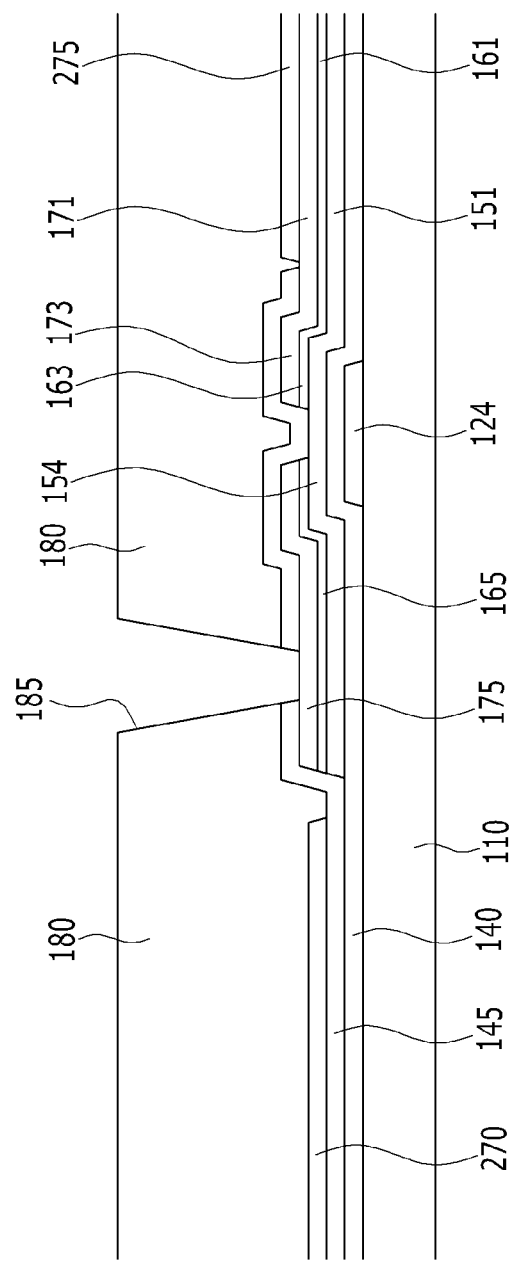
FIG. 22 is a cross-sectional view of the thin film transistor array panel of FIG. 21 taken along line XXII-XXII.
Figure 23:
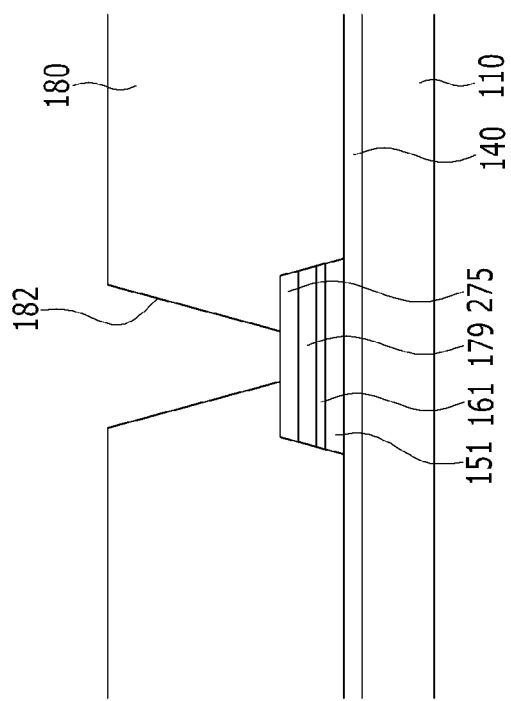
FIG. 23 is a cross-sectional view of the thin film transistor array panel of FIG. 21 taken along line XXIII-XXIII.

FIG. 17 is a cross-sectional view of the thin film transistor array panel of FIG. 16 taken along line XVII-XVII, FIG. 19 is a cross-sectional view of the thin film transistor array panel of FIG. 18 taken along line XIX-XIX, FIG. 20 is a cross-sectional view of the thin film transistor array panel of FIG. 18 taken along line XX-XX, FIG. 22 is a cross-sectional view of the thin film transistor array panel of FIG. 21 taken along line XXII-XXII, and FIG. 23 is a cross-sectional view of the thin film transistor array panel of FIG. 21 taken along line XXIII-XXIII.

Referring to FIG. 16 and FIG. 17, a gate line 121 (including a gate electrode 124) and storage electrode line 131 are formed on an insulation substrate 110. The storage electrode line 131 includes a protrusion 135 protruding downward.

Referring to FIG. 18 to FIG. 20, a gate insulating layer 140 is deposited on the gate line 121 and the storage electrode line 131. Then, a semiconductor 151, ohmic contacts 161 and 165, a data line 171, and a drain electrode 175 are simultaneously formed by using one mask. This is accomplished by varying the thickness of a photosensitive film depending on position.

Next, an interlayer insulating layer 145 is formed on the gate insulating layer 140, the data line 171, and the drain electrode 175.

Referring to FIG. 21 and FIG. 23, a second contact hole 148 is formed in the interlayer insulating layer 145, to expose the protrusion 135 of the storage electrode line 131, and the portion of the interlayer insulating layer 145 formed on the data line 171 is etched to expose the data line 171. At this time, the interlayer insulating layer 145 on an end 179 of the data line 171 is also etched to expose the end 179 of the data line 171.

Next, a reference electrode 270 is formed on the interlayer insulating layer 145, and a protection electrode 275 is formed on the data line 171. The protection electrode 275 extends to the end 179 of the data line 171.

The reference electrode 270 has a generally planar shape covering the pixel area, and is connected to the protrusion 135 of the storage electrode line 131 through the second contact hole 148. The protection electrode 275 is formed with the same material as the reference electrode 270, and contacts the data line 171 and the end 179 of the data line 171.

The reference electrode 270 and the protection electrode 275 are made of a transparent conductive material such as indium tin oxide (ITO) or indium zinc oxide (IZO).

Next, after a passivation layer 180 is formed on the reference electrode 270, the protection electrode 275, and the interlayer insulating layer 145, the passivation layer 180 and the interlayer insulating layer 145 are patterned to form a third contact hole 185 exposing the drain electrode 175 and a fourth contact hole 182 exposing the protection electrode 275 on the end 179 of the data line 171.

Next, as shown in FIG. 9 and FIG. 10, a pixel electrode 190 and a contact assistant 82 are formed on the passivation layer 180.

The pixel electrode 190 and the contact assistant 82 are made of a transparent conductive material such as ITO or IZO. Also, the pixel electrode 190 and the contact assistant 82 may be made of an opaque transparent conductive material such as an aluminum-based metal of aluminum (Al) or aluminum alloys, a silver-based metal of silver (Ag) or silver alloys, a molybdenum-based metal of molybdenum (Mo) or molybdenum alloys, chromium (Cr), tantalum (Ta), and/or titanium (Ti).

The contact assistant 82 is connected to the protection electrode 275 through the fourth contact hole 182.

The pixel electrode 190 is connected to the drain electrode 175 through the third contact hole 185, and includes a plurality of branch electrodes 191. As above, the branch electrodes 191 of the pixel electrode 190 extend in a direction substantially parallel to the gate lines 121, and may be inclined to form an angle of about 5 degrees to about 20 degrees with the gate lines 121.

On the other hand, the interlayer insulating layer 145 may not be positioned between the reference electrode 270 and the gate insulating layer 140. That is, the reference electrode 270 may directly contact the gate insulating layer 140, with the interlayer insulating layer 145 not being present in that area.

Figure 24:
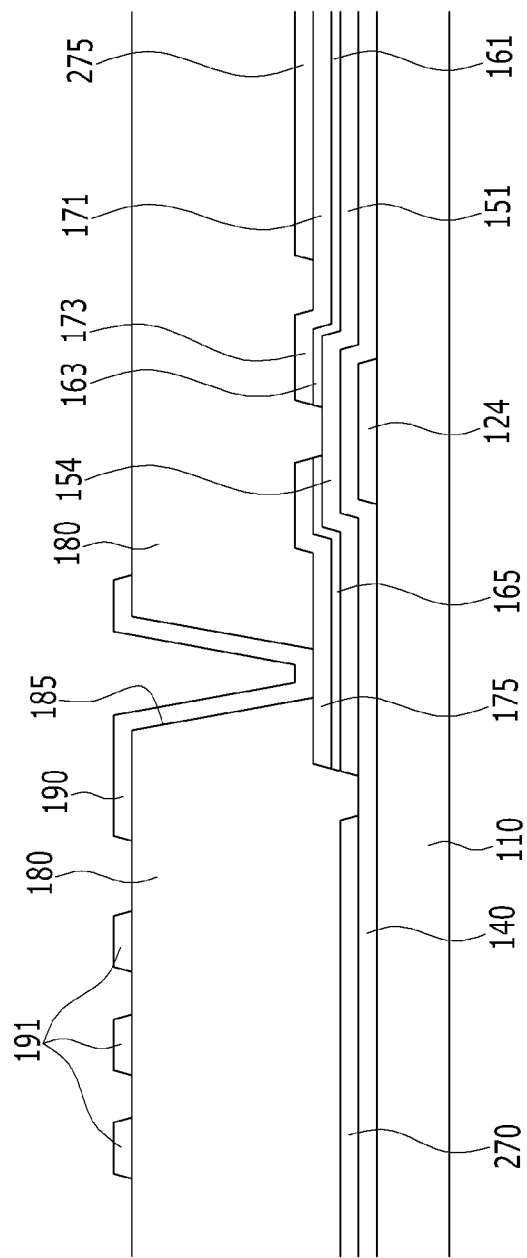
FIG. 24 is a cross-sectional view of a thin film transistor array panel according to another exemplary embodiment of the present invention.

FIG. 24 is a cross-sectional view of a thin film transistor array panel according to another exemplary embodiment of the present invention.

The thin film transistor array panel of FIG. 24 has a similar structure to that of the thin film transistor array panel according to FIG. 13 to FIG. 15. Description of similar structures is thus omitted.

Referring to FIG. 24, differently from the thin film transistor array panel of FIG. 13 to FIG. 15, in the thin film transistor array panel according to the present exemplary embodiment, an interlayer insulating layer 145 does not exist between the reference electrode 270 and the gate insulating layer 140.

The reference electrode 270 is formed on the gate insulating layer 140, and the third contact hole 185 (exposing the drain electrode 175) is only formed through the passivation layer 180.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
a substrate;
a gate line and a storage electrode line disposed on the substrate;
a gate insulating layer disposed on the gate line and the storage electrode line;
a semiconductor disposed on the gate insulating layer;
a data line disposed on the semiconductor and including a source electrode, the data line having an end and a lengthwise portion extending from the end to the source electrode;
a drain electrode disposed on the semiconductor and facing the source electrode;
a first electrode disposed on the gate insulating layer;
a protection electrode disposed along and contacting the data line so as to substantially cover the lengthwise portion of the data line;
a passivation layer disposed on the first electrode and the protection electrode; and
a second electrode disposed on the passivation layer, directly connected to the storage electrode line, and configured to receive a reference voltage from the storage electrode line,
wherein the protection electrode comprises the same material as the first electrode.

2. The thin film transistor array panel of claim 1, wherein the first electrode has an at least approximately planar shape, and the second electrode includes a plurality of branch electrodes.

3. The thin film transistor array panel of claim 2, wherein the first electrode is a pixel electrode, and the second electrode is a reference electrode.

4. The thin film transistor array panel of claim 3,
wherein the gate insulating layer and the passivation layer include a first contact hole exposing the storage electrode line.

5. The thin film transistor array panel of claim 4, wherein the first electrode is connected to the drain electrode, and the second electrode is connected to the storage electrode line through the first contact hole.

6. The thin film transistor array panel of claim 2, wherein the first electrode and the second electrode each comprise a transparent conductive material.

7. The thin film transistor array panel of claim 2, wherein the first electrode comprises a transparent conductive material, and the second electrode comprises an opaque conductive material.

8. The thin film transistor array panel of claim 1, wherein the protection electrode extends to an end of the data line.

9. The thin film transistor array panel of claim 8, further comprising a contact assistant disposed at a same layer as the second electrode,
wherein the passivation layer includes a fourth contact hole exposing a portion of the protection electrode extending to the end of the data line, and
the contact assistant is connected to the protection electrode through the fourth contact hole.

10. The thin film transistor array panel of claim 9, wherein the protection electrode and the contact assistant each comprise a transparent conductive material.

* * * * *